(12) United States Patent
Striakhilev et al.

(10) Patent No.: US 10,439,013 B2
(45) Date of Patent: *Oct. 8, 2019

(54) PIXEL HAVING AN ORGANIC LIGHT EMITTING DIODE AND METHOD OF FABRICATING THE PIXEL

(71) Applicant: Ignis Innovation Inc., Waterloo (CA)

(72) Inventors: Denis Striakhilev, Waterloo (CA); Arokia Nathan, Cambridge (GB); Yuri Vygranenko, Waterloo (CA); Sheng Tao, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/193,702

(22) Filed: Nov. 16, 2018

(65) Prior Publication Data

US 2019/0088729 A1    Mar. 21, 2019

Related U.S. Application Data

(63) Continuation of application No. 15/403,313, filed on Jan. 11, 2017, now Pat. No. 10,163,996, which is a continuation of application No. 13/112,654, filed on May 20, 2011, now abandoned, which is a continuation of application No. 10/546,695, filed as application No. PCT/CA2004/000256 on Feb. 24, 2004, now Pat. No. 7,948,170.

(30) Foreign Application Priority Data

Feb. 24, 2003  (CA) .................................. 2419704

(51) Int. Cl.
| | |
|---|---|
| H01L 27/32 | (2006.01) |
| H01L 51/52 | (2006.01) |
| H01L 51/56 | (2006.01) |
| H01L 27/12 | (2006.01) |

(52) U.S. Cl.
CPC ...... *H01L 27/3248* (2013.01); *H01L 27/3246* (2013.01); *H01L 27/3258* (2013.01); *H01L 27/3262* (2013.01); *H01L 27/3272* (2013.01); *H01L 27/3276* (2013.01); *H01L 51/5234* (2013.01); *H01L 51/56* (2013.01); *H01L 27/124* (2013.01); *H01L 27/1248* (2013.01); *H01L 2227/323* (2013.01); *H01L 2251/5315* (2013.01)

(58) Field of Classification Search
CPC ............. H01L 27/3246; H01L 27/3248; H01L 51/5234
See application file for complete search history.

(56) References Cited

U.S. PATENT DOCUMENTS 10,163,996 B2 * 12/2018 Striakhilev ......... H01L 27/3246

* cited by examiner

*Primary Examiner* — Karabi Guharay
(74) *Attorney, Agent, or Firm* — Stratford Managers Corporation

(57) ABSTRACT

A pixel having an organic light emitting diode (OLED) and method for fabricating the pixel is provided. A planarization dielectric layer is provided between a thin-film transistor (TFT) based backplane and OLED layers. A through via between the TFT backplane and the OLED layers forms a sidewall angle of less than 90 degrees to the TFT backplane. The via area and edges of an OLED bottom electrode pattern may be covered with a dielectric cap.

22 Claims, 13 Drawing Sheets

PIXEL HAVING AN ORGANIC LIGHT EMITTING DIODE AND METHOD OF FABRICATING THE PIXEL

CROSS-REFERENCE TO RELATED APPLICATIONS

This application is a continuation of U.S. patent application Ser. No. 15/403,313, filed Jan. 11, 2017, now U.S. Pat. No. 10,163,996, which is a continuation of U.S. application Ser. No. 13/112,654, filed May 18, 2006, which is a continuation of U.S. application Ser. No. 10/546,695, filed May 18, 2006, now U.S. Pat. No. 7,948,170, which is a U.S. National Stage of International Application No. PCT/CA2004/00256, filed Feb. 24, 2003, which claims priority to Canadian Patent No. 2,419,704, filed Feb. 24, 2003, each of which is hereby incorporated by reference herein in its entirety.

FIELD OF THE INVENTION

This invention relates to a pixel, more particularly, to a pixel having an organic emitting diode.

BACKGROUND OF THE INVENTION

Organic light emitting diodes (OLEDS) are electro-luminescent (EL) devices for emitting light. The OLED generates light by a current flowing through an organic compound. Pixels including the OLEDs have various advantages, i.e. simple structure, fast response and wide viewing angle. There are two types of matrix displays with the OLEDs, passive type and active type. In the active matrix display, thin-film transistors (TFT) are provided in each pixel to drive the OLEDs of display. The active matrix eliminates high peak driving currents and thereby enables high-resolutions and high information density, improves power consumption and life-time compared to the passive matrix.

Vertical pixel architecture, in which the TFT and the OLED device are stacked vertically, has been developed. Such architecture can achieve higher aperture ratios. This favors using lower mobility amorphous silicon TFT backplanes compared polysilicon TFT technology, which is of higher mobility but also of higher cost.

The difficult part in building the vertical stacked pixels is to make a TFT backplane suitable for subsequent OLED fabrication and provide high yield and good performance of OLED pixels. The OLED device is typically made of very thin layers. Overall thickness of organic layers in the OLED is of the order of 100 nm. For this reason, it requires a smooth substrate to achieve good performance and yield. Step-wise features on the substrate surface and roughness can cause deterioration of light-emitting properties or OLED device failure due to shorts between its electrodes.

It is, therefore, desirable to provide new pixel architecture, which can achieve a high aperture rate, and at the same time, higher yield rate.

SUMMARY OF THE INVENTION

It is an object of the invention to provide novel pixel architecture that obviates or mitigates at least one of the disadvantages of existing pixels.

In accordance with an aspect of the present invention, there is provided vertical pixel architecture in which a planarization dielectric layer is disposed between a TFT based backplane and OLED layers. The planarization dielectric layer is thick enough to smoothen a TFT substrate profile to such an extent that will make it suitable for subsequent fabrication of the OLEDs. Preferably, the planarization dielectric and subsequent electrode layer have a roughness of the order of 1 nm to permit successful OLED fabrication.

Electrical connection between TFT circuit and OLED is provided by means through-via made in planarization dielectric.

In accordance with a further aspect of the present invention, there is provided a vertical pixel architecture in which continuous sidewall coverage is provided by pixel electrode material in a through-via profile provided in the planarization dielectric. This is achieved by the formation of sloped sidewalls of the through-via. Preferably, the angle between the via and a TFT substrate is less than 45 degrees.

In accordance with a further aspect of the present invention, the interconnection between TFT final metal and OLED bottom electrode in vertical pixel architecture is provided via a smooth contact plate made of conductive material.

In accordance with a further aspect of the present invention, there is provided a vertical pixel architecture in which a dielectric layer is deposited and patterned on the top of the pixel electrode in such a way that it covers pixel via and the edges of the pixel electrode.

Other aspects and features of the present invention will be readily apparent to those skilled in the art from a review of the following detailed description of preferred embodiments in conjunction with the accompanying drawings.

BRIEF DESCRIPTION OF THE DRAWINGS

The invention will be further understood from the following description with reference to the drawings in which.

DETAILED DESCRIPTION OF THE PREFERRED EMBODIMENTS

Figure 1:
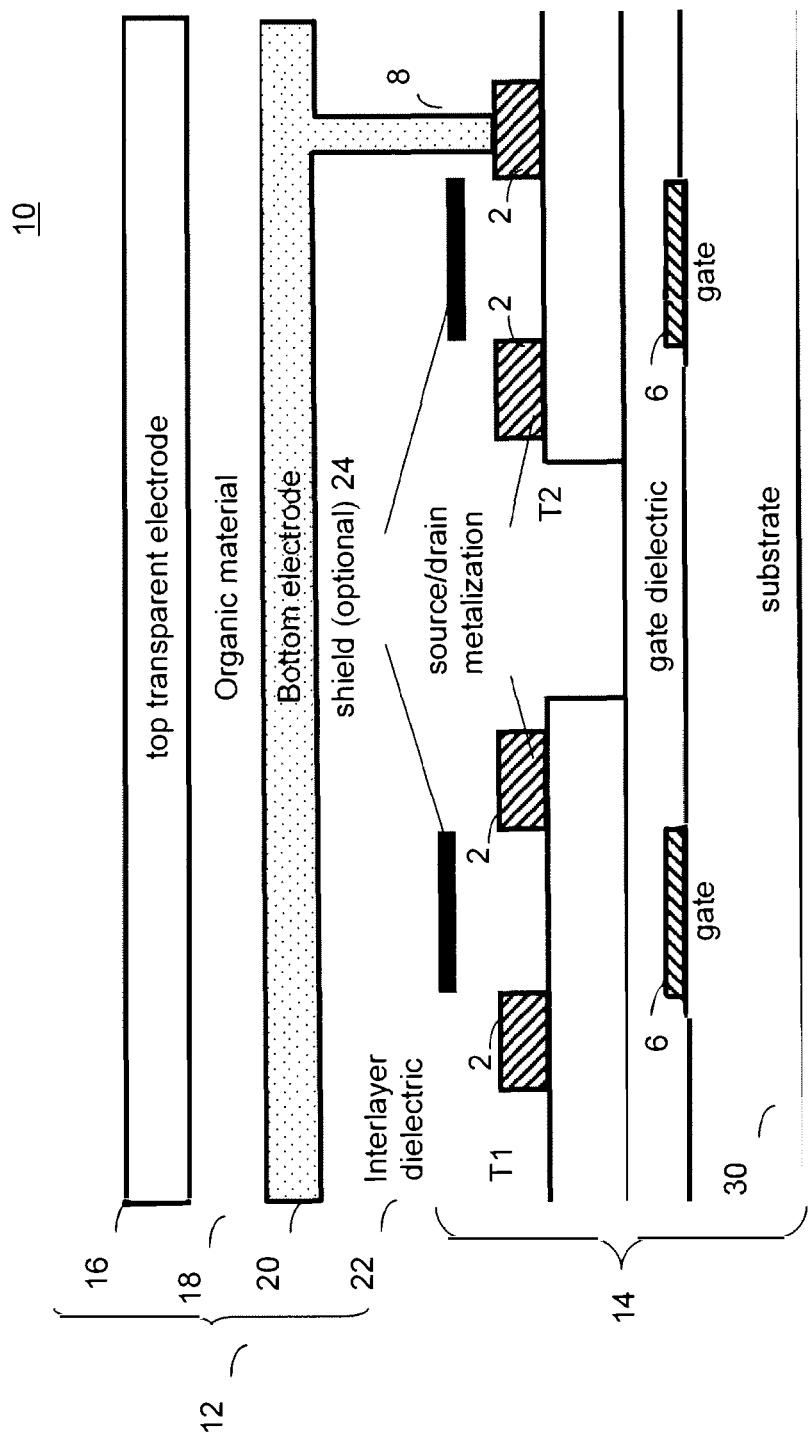
FIG. 1 is a schematic cross-section view showing a vertically integrated pixel in accordance with an embodiment of the present invention.

A vertically integrated pixel of the present invention is described. FIG. 1 shows a vertically integrated pixel 10 in accordance with an embodiment of the present invention. The pixel 10 includes OLED device layer 12 and a TFT based backplane 14 (hereinafter referred to as TFT backplane).

The OLED device 12 includes one or more organic layers, a cathode and an anode. In the description, layers between the cathode and the anode are referred to as OLED layers 18. The OLED layers 18 may be incorporating an electron transport layer, an organic light emitting layer, a hole transport layer, and a hole injection layer. In FIG. 1, an OLED top electrode 16 and an OLED bottom electrode 20 are shown as the cathode and the anode, respectively.

The top electrode 16 is transparent to enable the light to be emitted by the OLED in the direction opposite to the substrate (i.e., top-emitting OLED). However, reverse top-emitting OLED structure, where the bottom electrode 20 is a cathode, and the top electrode 16 is an (transparent) anode, is also possible.

Each pixel of the TFT backplane 14 includes TFT pixel circuits formed on a substrate 30. In FIG. 1, two TFTs T1 and T2 form a pixel circuit. Each of the transistors T1-T2 has metallization for a source, a drain and a gate 6. In FIG. 1, "2" represents either a source node or a drain node. However, the pixel 10 may include more than two transistors.

The OLED bottom electrode 20 is formed on the top of the TFT backplane 14, and is separated from the backplane 14 by a dielectric layer 22. The dielectric layer 22 is continuously provided everywhere on the top of the TFT pixel circuit except at a through-via 8, which provides electrical connection between a specific node of the TFT pixel circuit and the OLED bottom electrode 20. This specific node may be source node or drain node of a TFT, which depends on pixel circuit design and order of deposition for the OLED electrodes and layers. The details of circuit design and OLED fabrication are not to restrict the applicability of the present invention.

Preferably, the planarization dielectric and subsequent electrode layer have a roughness of the order of 1 nm to permit successful OLED fabrication. Optionally, a shield electrode 24 is provided on the top of TFTs.

Figure 2:
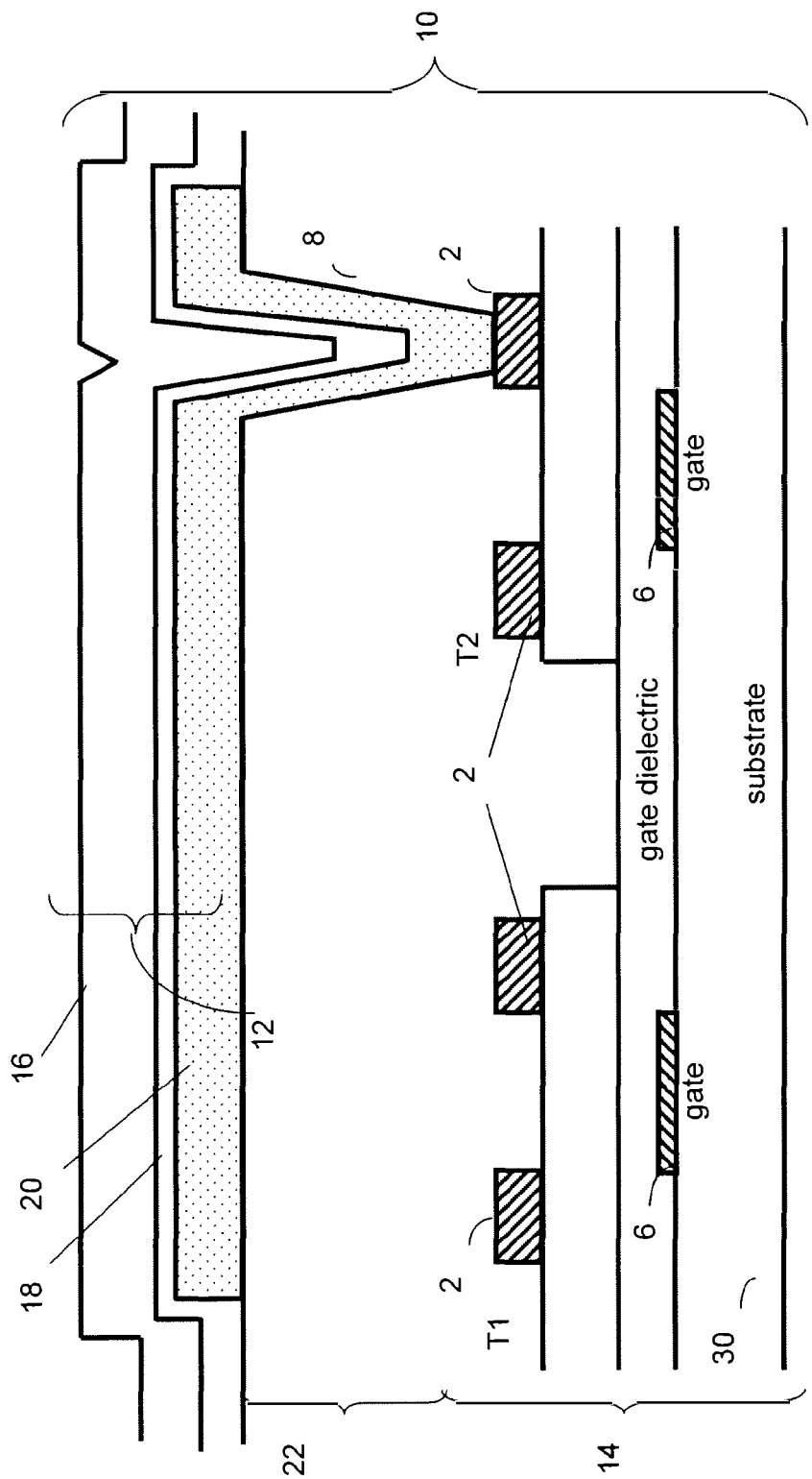
FIG. 2 is a schematic cross-section view showing an example of the pixel of FIG. 1.

FIG. 2 shows an example of the pixel 10 of FIG. 1. In FIG. 2, the sidewalls of the through-via 8 are sloped. The OLED bottom electrode material is disposed on the top surface of the dielectric layer 22 and along the sidewall of the sloped through-via 8.

Figure 3:
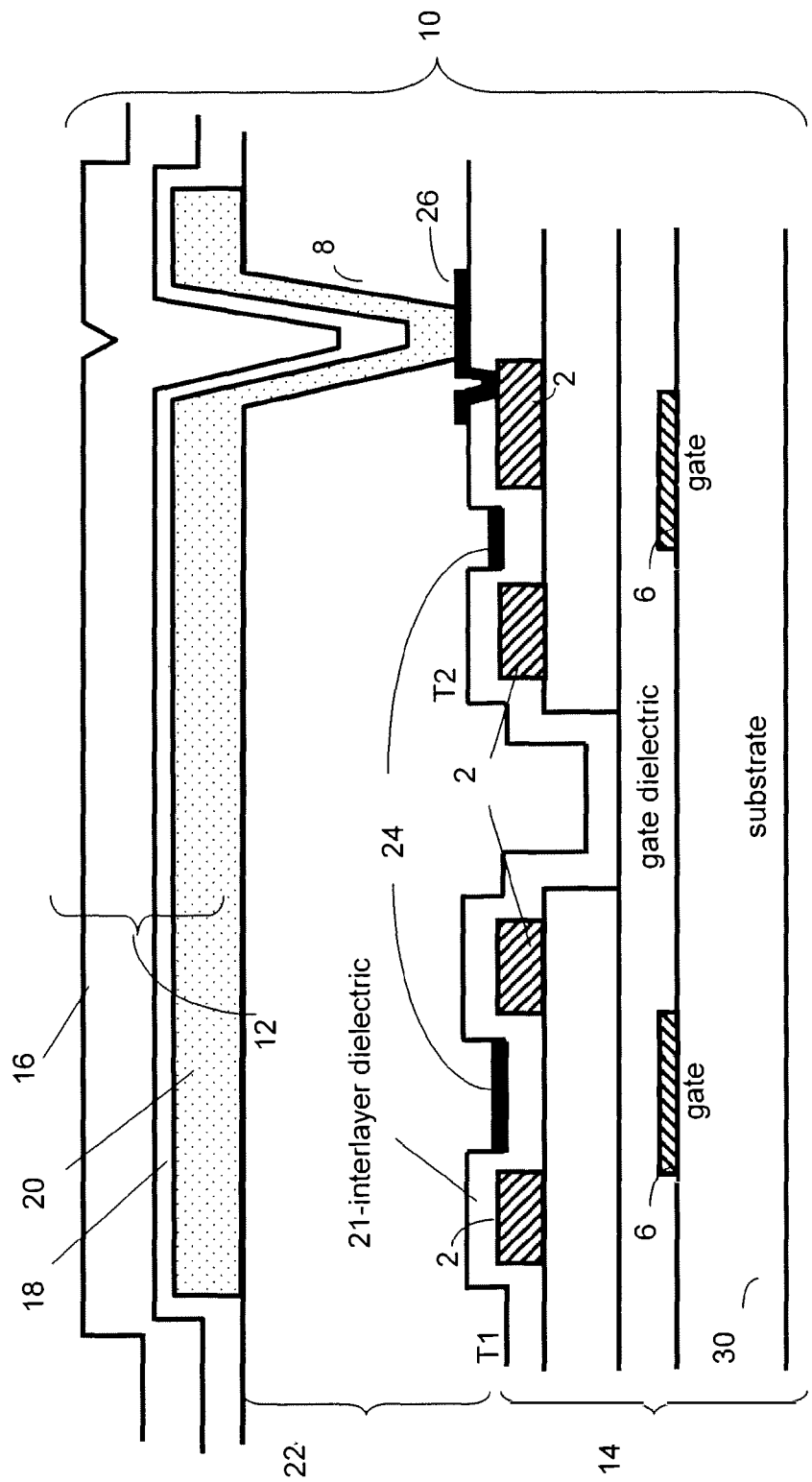
FIG. 3 is a schematic cross-section view showing an example of the pixel of FIG. 1, which incorporates a shield electrode.

FIG. 3 is another example of the pixel of FIG. 1. In FIG. 3, the shield electrode 24 is provided above the TFT layers to keep the potential right on the top of the TFT pixel circuit at certain designed level regardless of the potential of the pixel electrode. The shield electrode 24 may be a thin-film conductor, Al, Al-alloy, Mo, Cr or the like. An interlayer dielectric 21 is provided between source/drain and shield layers. The connection between the desired pixel circuit node and the OLED bottom electrode 20 is made by means-of a via in the interlayer insulator 21, an interconnection plate 26 formed in the shield metal layer and the through-via 8 formed in the dielectric layer 22.

The transistor structure of FIGS. 1-3 is typical for bottom-gate amorphous silicon TFT, and it is shown here as one possible example only. However, the method of pixel integration described here may be applicable in general to any appropriate known TFT backplane, including recrystallized or deposited poly-silicon, micro- and nano-crystalline silicon, CdSe and others.

Active matrix TFT backplane may be fabricated by successive deposition and patterning of metal, insulator and semiconductor layers leading to an overall profile height of the structure that is in the range of a few 100 nm to 1 micron, with nearly vertical or sharp-angled sidewalls of the structures. On the other hand, in high performance small molecule and polymer organic light emitting devices, active organic layers have an overall thickness in the range of 10-100 nm. This implies that it is desirable to provide the OLED substrate with the roughness in 1 nm range to prevent electrical shorts between OLED layers or top and bottom electrodes. In addition, it is desirable that the substrate is either planer or has sufficiently smooth features whose vertical profile does not prevent reliable step coverage with thin OLED layers and their continuity, where necessary.

In the embodiment of the preset invention, the planarization dielectric and subsequent electrode layer are formed so as to have a roughness of the order of 1 nm. The dielectric layer 22 smoothens or planarizes the vertical profiles of the structures on the substrate with fabricated TFT 14. Further, the through-via profile in the dielectric layer 22 enables continuous sidewall coverage by the OLED bottom electrode material, and reduction of thickness of the pixel electrode.

The dielectric layer 22 of the pixel 10 is described in detail. The dielectric layer 22, which is used for separating the TFT backplane 14 and the OLED bottom electrode 20, smoothens or planarizes the vertical profiles of the structures on the substrate 30 with the fabricated TFT backplane 14. This ensures continuity of the electrodes 16, 20 and organic layers 18 in the OLED device 12. This smooting/planarizing is achieved by using a planarizing dielectric, rather than one coating the substrate conformally. The planarizing dielectric may be an organic polymer such as benzocyclobutene (BCB), polyimide, polyamide, acrilic and others. Minimum thickness of planarization layer required depends on planarization properties of the dielectric and the profile height of TFT backplane. The thickness of planarizing dielectric can be between 0.5 and 5 .mu.m. In the embodiment of the present invention, BCB layer, about 3 micron-thick, produced from photosensitive BCB-material is used as the planarizing layer.

Planarizing dielectric layers are most often produced by application of corresponding initial material or monomer, which can be polymerized on the substrate by means of thermal cure, UV-cure with our without catalyst or by other method. The initial or monomer material can or cannot be patterned by photo-exposure. This property depends on chemical formulation of initial material or monomer by the manufacturer, whether the photosensitive components were added or not. The processing of the former may include steps such as application of initial material, pattern definition by photoexposure trough a photomask, pattern developing and final cure. As a result a patterned polymer layer is obtained. The processing of the latter may include application of initial material, cure, application and patterning of the mask, patterning cured polymer by means of plasma or wet etching with the mask, strip the mask. In some cases, like polyimides and BCB, there are available both photosensitive and non-photosensitive versions of initial material that can lead to about the same chemical composition and structure of polymer dielectric material after final cure.

In the embodiment of the present invention, BCB-layer made of photosensitive initial material is used as a planarization dielectric. However, the present invention may be applicable to different types of material, such as but not limited to other planarization materials made of both of photosensitive and non-photosensitive initial formulations.

Figure 4:
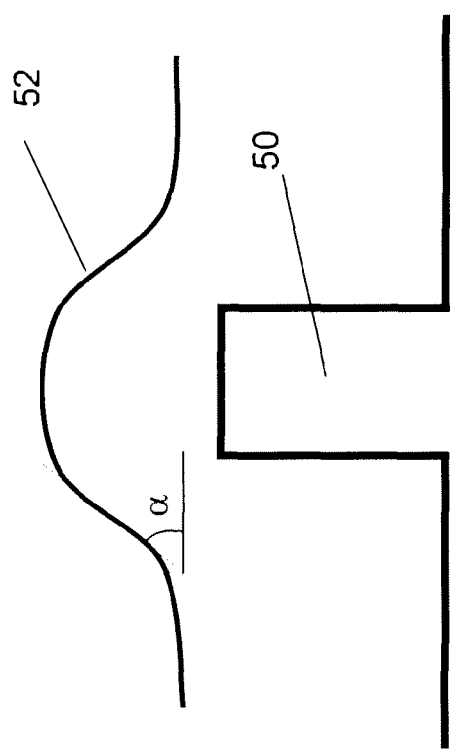
FIG. 4 is a schematic diagram showing an example of surface planarization with BCB.

FIG. 4 shows the planarization effect of BCB-layer. In this example, a TFT substrate is schematically shown as-having stepwise profile of the patterns 50 with nearly vertical sidewalls and profile height of 0.5-0.9 .mu.m before application of BCB. After application of BCB-film, the patterns 50 are translated into 0.3-0.5 micron profiles 52 with the sidewall angle a about 10 degrees on the surface of BCB dielectric. In this example, the BCB-polymer film was produced by spin-coating photosensitive material (photosensitive BCB) with subsequent soft bake, exposure, post-exposure bake, pattern developing, solvent removal and cure. The process conditions are shown in Table 1. TABLE-US-00001 TABLE 1 Process conditions for planarization layer Nr Step Conditions 1 Spin-coating 2500-4000 rpm, 25-40 sec 2 Soft-bake 60-70.degree. C., 90 sec 3 Exposure 12-60 sec 4 Post-exposure bake 50-60.degree. C., 30 sec 5 Developing 2-4 min 6 Solvent removal 75.degree. C., 60 sec 7 Cure 190-250.degree. C., 2-4 hrs.

The through-via profile in the dielectric 22 of the pixel 10 is now described in detail. The OLED bottom electrode 20 is a conductive material such as indium-tin oxide (ITO) or the like, a metal film, Au, Pd, Ni or the like, sputtered, evaporated or fabricated by other method of thin film deposition. Other metals or thin multi-layer metal coatings may be also applicable. Typically, conductive layers in a flat-panel display substrate are fabricated by sputtering which has limitations in terms of step coverage. On the other hand, the roughness of the conductive layers such as metal films and ITO, increases with layer thickness. A thinner electrode layer produces a smoother surface suitable for OLED fabrication. This also reduces the cost of production. Therefore, a reduction of the thickness of the pixel electrode while maintaining its continuity over substrate profile is desirable.

If the through-via had a nearly vertical sidewall, the thickness of the metal to cover sidewall continuously, could be of the same order as the depth of the via, which is equal to the thickness of the planarization dielectric layer (in a range of few micron). In the pixel 10 of FIGS. 2 to 3, the sidewall is made sloped rather than vertical. That permits the thickness of the pixel electrode to be reduced substantially in a vertically stacked pixel structure.

Figure 5:
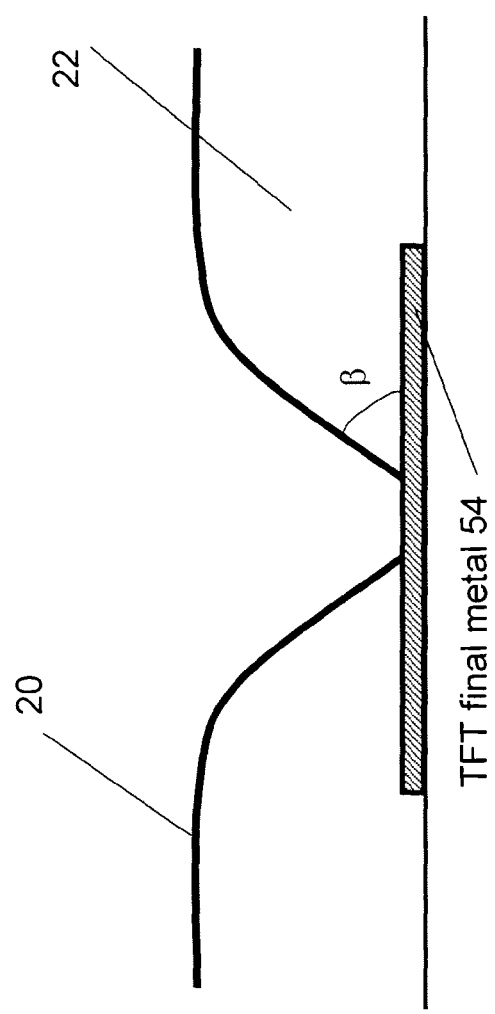
FIG. 5 is a schematic cross-section view showing a sidewall slope .beta. of the pixel of FIGS. 2 to 3.

FIG. 5 shows one example of a sidewall slop inside the via 8 of FIGS. 2 and 3. In FIG. 5, an angle .beta. between the OLED bottom electrode 20 on the sidewall and a TFT final material 54 is less than 90 degrees. If planarizing polymer dielectric is formed from photosensitive initial formulation, the sloped sidewall can be achieved by means of appropriate exposure conditions.

An example of sidewall slope control in the through-via for BCB-layer (i.e., dielectric 22), which is produced from photosensitive initial material, is presented in Table 2. TABLE-US-00002 TABLE 2 Sidewall angle in cured BCB layer which was produced from photosensitive BCB-material as a function of exposure time. Exposure time, sec Sidewall angle 20 45 30 33 180 27.

The formation of the layer and patterning of the vias were achieved by means of spin-coating photosensitive BCB material with subsequent soft-bake, light-exposure, developing, developer solvent removal and cure. In Table 1, the sidewall angle .beta. between the planarization layer 22 and the TFT final material 54 is shown as a function of photosensitive BCB-exposure time.

After the exposure, the film underwent 30 seconds post-exposure bake at 55. degree. C. and was developed for around 3 minutes in the developer solvent followed by 60 second bake at 75.degree. C. for developer solvent removal and then final cure.

The conditions for spin-coating, soft-bake, exposure, post-exposure bake and final cure are variable, and may depend on pixel design requirements. Recommendations about process conditions of Photo-BCB are given, for example, by "Cyclotene™ 4000 Series Advanced Electronic Resins (Photo-BCB)" of Dow Chemical (™), at hftp://www.dow.com/cyclotene/prods/402235 htm.

As shown in Table 2, the sidewall angle .beta. relates to the exposure time. The sidewall angle .beta. becomes smaller when exposure time is longer. For example, for the sidewall angle .beta. of less than 45 degrees and the planarization dielectric thickness of around 3 .mu.m, the continuous coverage of the via sidewalls was achieved with a pixel electrode thickness of order 100 nm. This is much less than the through-via depth and enables the electrode surface of the OLED bottom electrode 20 to be sufficiently smooth.

For polymer dielectric material made of non-photosensitive initial formulation, the sloped sidewall can be also achieved. For example, this can be done, by optimizing masking and plasma etching steps.

The parameters, materials and/or process of fabricating the sloped through-vias 8 are adjusted so as to: ensure the continuous sidewall coverage by a material of the pixel electrode; make the roughness of the OLED electrode small enough (1 nm order) to prevent electrical shorts between the OLED top electrode 16 and the OLED bottom electrode 20.

Figure 6:
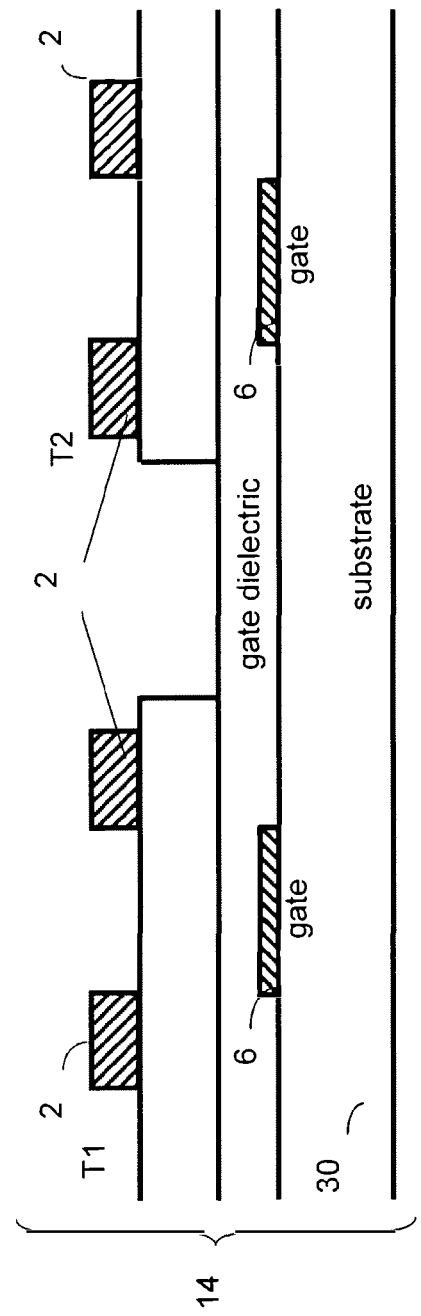
FIGS. 6 to 8 are schematic diagrams showing fabricating process of the pixel of FIG. 2.
Figure 7:
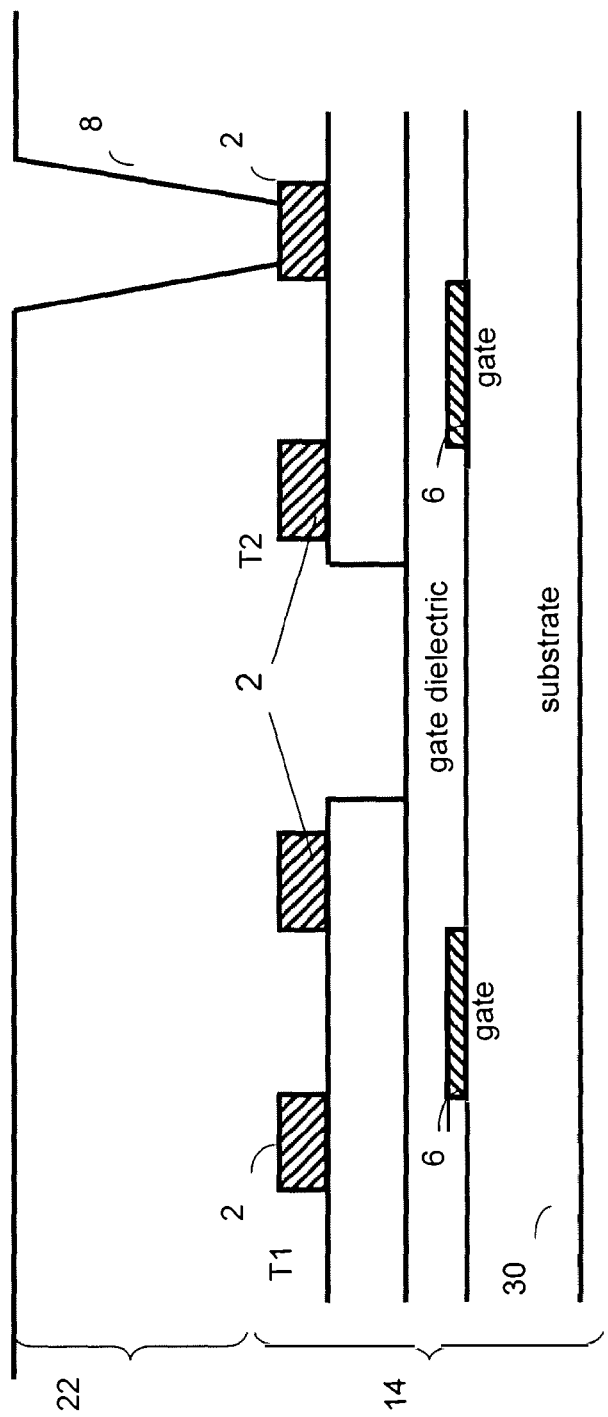
Figure 8:
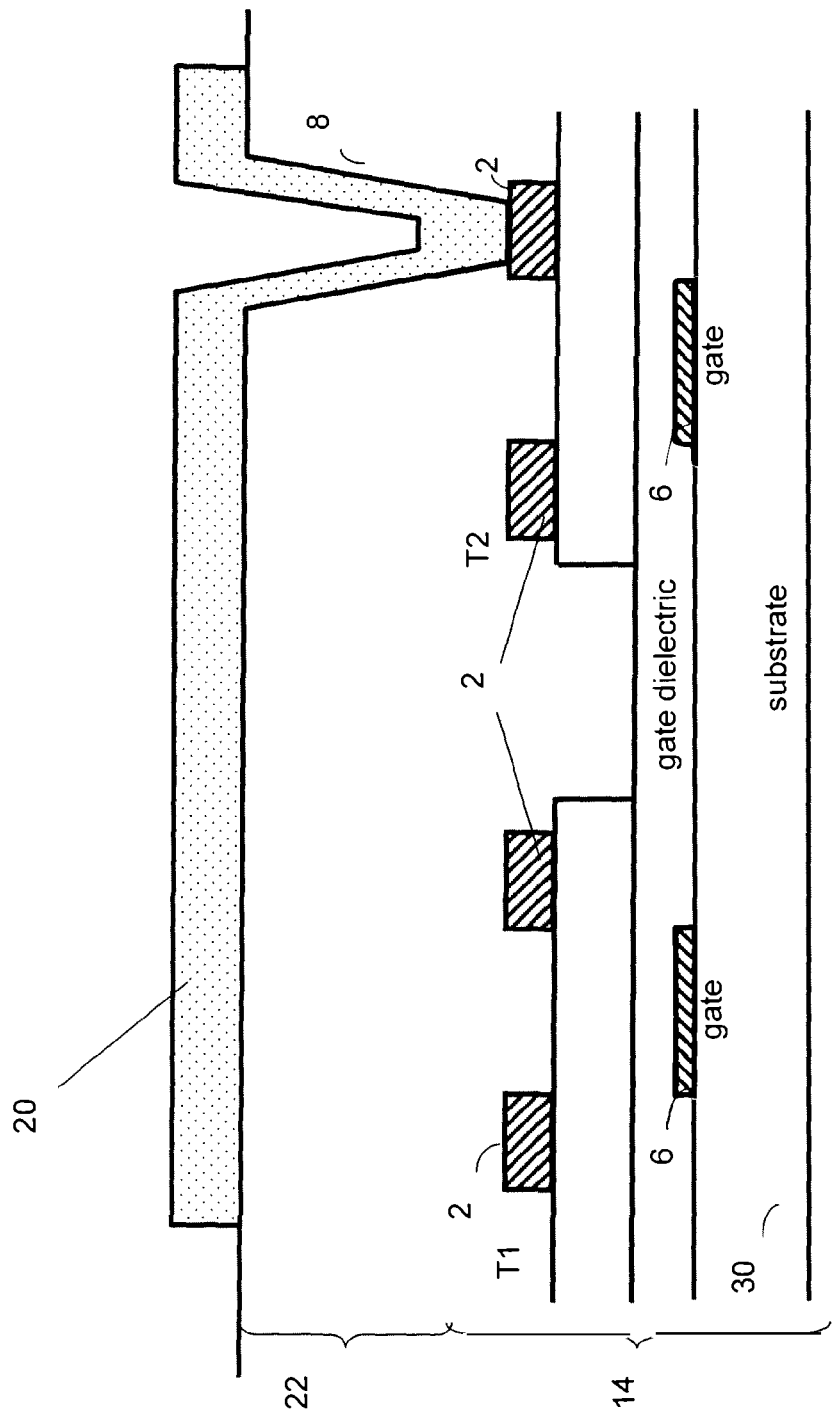

One example of fabricating the pixel 10 of FIG. 2 is shown in FIGS. 6 to 8. First, the TFT backplane 14 is fabricated (FIG. 6) on the substrate 30. Next, the TFT backplane 14 is coated with a planarization layer 22, where the vias 8 with sloped sidewalls are opened to the selected nodes of the TFT backplane 14 (FIG. 7). For BCB planarization layer made of photosensitive formulation, BCB material is applied by spin coating, and processed including soft-bake, UV-exposure through a photomask, post-exposure cure, developing, solvent removal and final cure. This sequence gives patterned material (with the through-vias 8) whose layer thickness and via sidewall slope depend on processing conditions, such as the exposure time as described above. Typically, surface roughness of cured BCB-layer is about 1 nm. Then, a thin residual layer on the bottom of the through-vias 8 is removed by plasma etching. Etching conditions are optimized for short etching time and minimum roughening of the BCB surface. For example, the fabrication of the pixel 10 may include plasma etching in CF4+O2 gas mixture or SF6+O2 gas mixture, a combination of high power high density plasma (for example, inductively coupled plasma) and low power reactive ion etching to achieve short etching time (few-20 seconds); and virtually no change in roughness after plasma etching.

Subsequently, a conductive material is deposited and patterned to form the OLED bottom electrode 20 (FIG. 8). Finally; the OLED layers 18 and transparent electrode top electrode 16 of the OLED are continuously applied over the pixels (FIG. 2).

The shield electrode 24 of FIG. 3 is now described in detail. As shown in FIG. 3, optional shield electrode can be incorporated in a pixel structure. After formation of the TFT backplane 14, interlayer dielectric 21 is deposited. This can be done by means of CVD, plasma-enhanced CVD process or other method. Silicon nitride, silicon oxide or silicon oxide nitride with the thickness between 0.1 and 1 .mu.m can be used as the interlayer dielectric 21. After formation of the vias in the interlayer dielectric that provide interconnection between source-drain and shield metallization layers, shield metal layer is deposited and patterned to form the shield electrodes 24 and interconnection plates 26. The interconnection plates 26 serve to carry the potential from the certain node of TFT pixel, which can be either source or drain of a TFT, to the bottom electrode of OLED device 20. Then, the planarization layer 22 is applied and patterned, as described above, which is followed by deposition and patterning of OLED bottom electrode 20, deposition of the OLED layers 18 and top transparent electrode 16.

Figure 9:
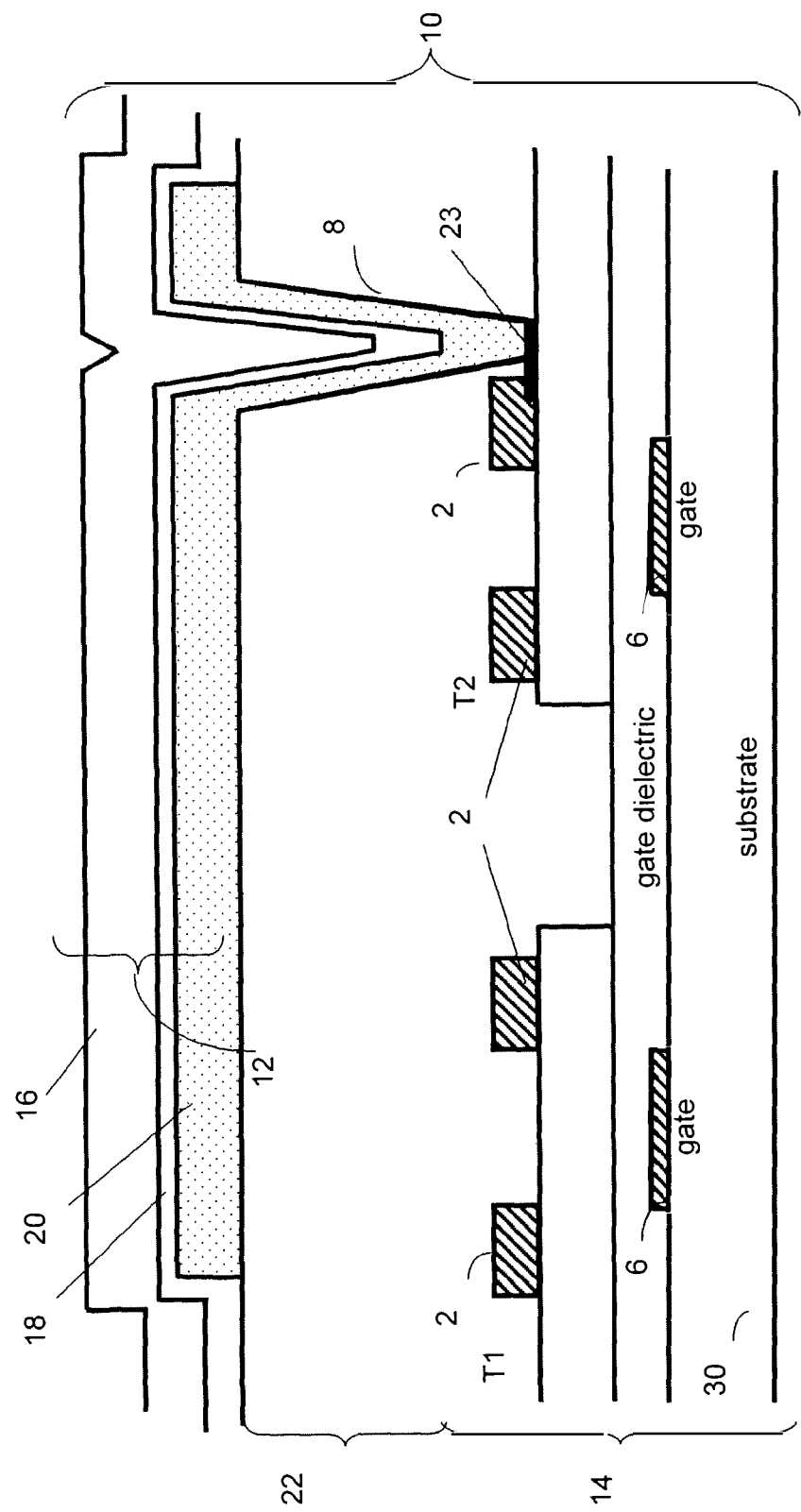
FIG. 9 is a schematic cross-section view showing an example of the pixel of FIG. 1, which incorporates a contact plate.

FIG. 9 shows another example of the pixel of FIG. 1. In FIG. 9, TFT source/drain metal overlaps a contact plate 23 made of thin and smooth conductive material, such as Cr, Mo or other. The contact plate 23 is formed by deposition and patterning of conductive films on the flat portion of pixel area. Preferably, the thickness of the contact plate 23 is between 50 and 150 nm.

The contact between the certain node of the TFT circuit, which is in the source/drain metallization layer of the TFT backplane 14, and the OLED bottom electrode 20 is made via the contact plate 23 rather than directly.

Depending on structure and fabrication method of the TFT backplane 14, the source-drain metal may have surface roughness well in excess of 1 nm. This may be the case if relatively thick metal layer, especially Al or Al-alloy, is used for source/drain metallization. Such a source-drain metallization can be required for the reasons associated with particular TFT fabrication process or display design. For example, highly conductive routing metallization is beneficial for reduction of power dissipation or better OLED brightness uniformity over the substrate area, especially if the display size is large. If such a source/drain metal would be in a direct contact with the bottom electrode of the OLED 20, its surface roughness is translated into the roughness of electrode 20 inside via area. This can make this area a source of shortages between OLED electrodes 20 and 16 and therefore cause OLED failure. Thus, in the pixel of FIG. 9, the contact to the bottom OLED electrode 20 is made via the smooth contact plate 23 formed in separate layer. In addition, if the TFT final metal (source/drain-metal) 2 is Al or Al-alloy or the like, and the bottom OLED electrode 20 is conductive oxide such as ITO, having a contact to the electrode 20 made of Cr, Mo or the like instead of Al/Al-alloy will reduce contact resistance, heat dissipation in the contact and improve overall contact reliability.

The contact plate 23 is formed before source/drain metallization of the TFT backplane 14. The TFT source drain-metal, which is formed next, has to overlap some portion of the contact plate 23 but leave a sufficient portion open for formation of via 8. In addition, it is desirable that source/drain metal can be selectively etched over contact plate metal. For example, if source/drain metal is Al or Al-alloy, using Cr for contact plate would provide excellent wet-etch selectivity. Roughness of the order 1 nm is easy to achieve with thin layers of metals such as Cr, Mo, Ti produced by sputtering, evaporation or other methods. Appropriate thin multi-layer metal coating can off cause be also used for contact plate 23.

After the TFT backplane 14 with the contact plate 23 is formed, further steps, application and patterning of the planarization dielectric layer 22, deposition and patterning of the bottom OLED electrode 20, deposition of the OLED layers 18 and OLED top electrode are performed in a manner described above.

Figure 10:
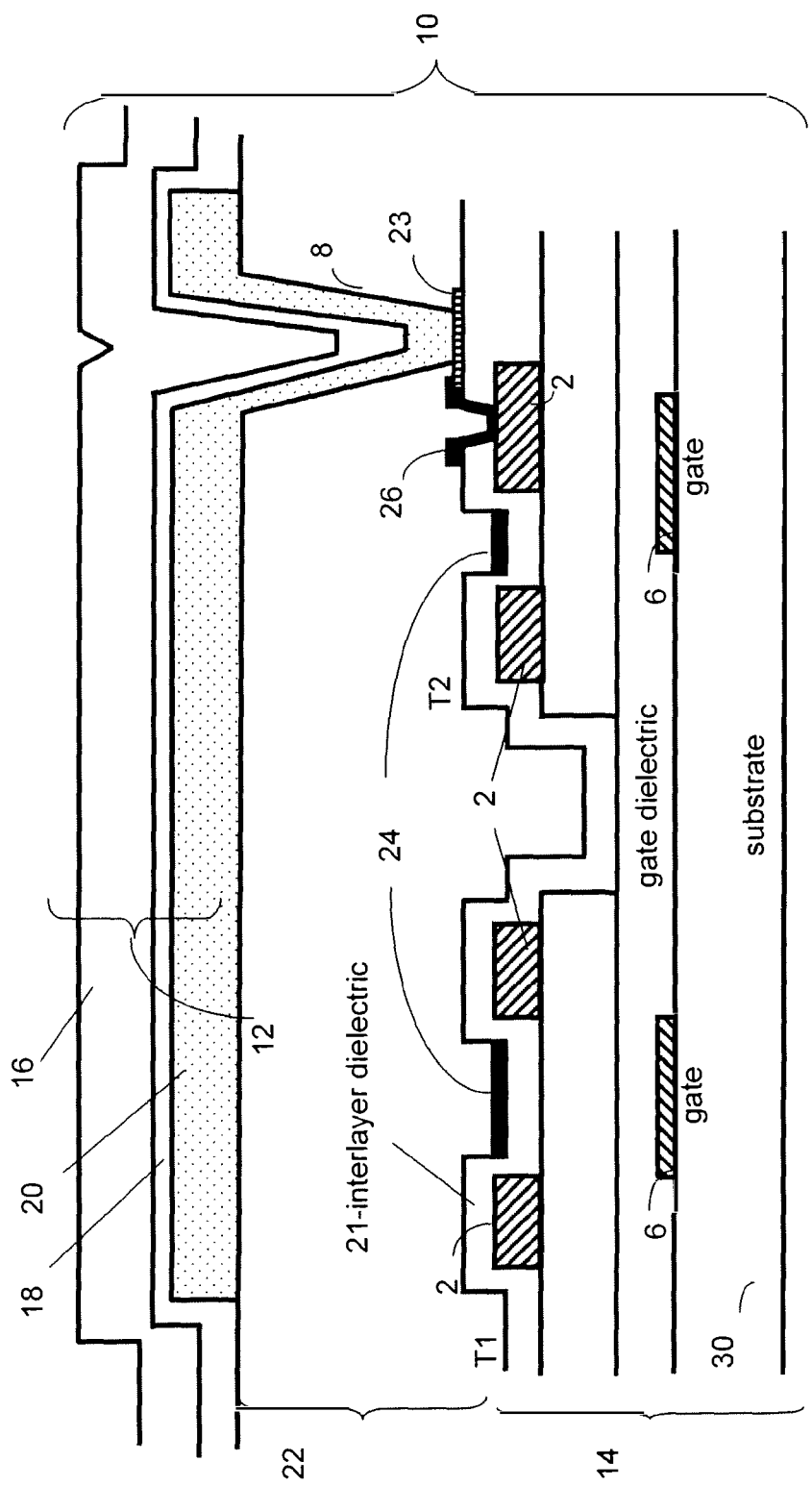
FIG. 10 is a schematic cross-section view showing an example of the pixel of FIG. 1, which incorporates a shield electrode and a contact plate.

FIG. 10 shows another example of the pixel of FIG. 1. In FIG. 10, the pixel has the shield electrode 24 and the contact plate 23. As described above, the shield 24 is formed to keep electric potential on the top of the TFTs at certain desired level. As the TFT backplane 14 is formed, the interlayer dielectric 21 is deposited. Then the contact plate 23 is formed of a thin and smooth metal layer such as Cr, Mo or the like on a flat portion of the pixel area. Preferably, the thickness of the contact plate 23 is between 50 and 150 nm. The vias in the dielectric 21 are patterned to provide interconnections between the source/drain and shield metallization levels where necessary. Then, shield metal is deposited and patterned to form the shield electrodes 24 and the interconnection plates 26. The interconnection plate 26 is to overlap the contact plate 23 but to leave its sufficient portion open, as shown schematically in FIG. 10. Preferably, the shield metal is selectively etched over the contact plate metal. As the TFT backplane 14 with the shield electrodes 24 and the contact plates 23 is formed, the planarization dielectric 22 is applied and though-via 8 is formed on the top of the portion of contact plate 23, which is free from shield metal (FIG. 10). Further steps (deposition and patterning of the bottom OLED electrode 20, deposition of the OLED layers 18 and OLED top electrode) may be performed in a similar manner as described above.

Figure 11:
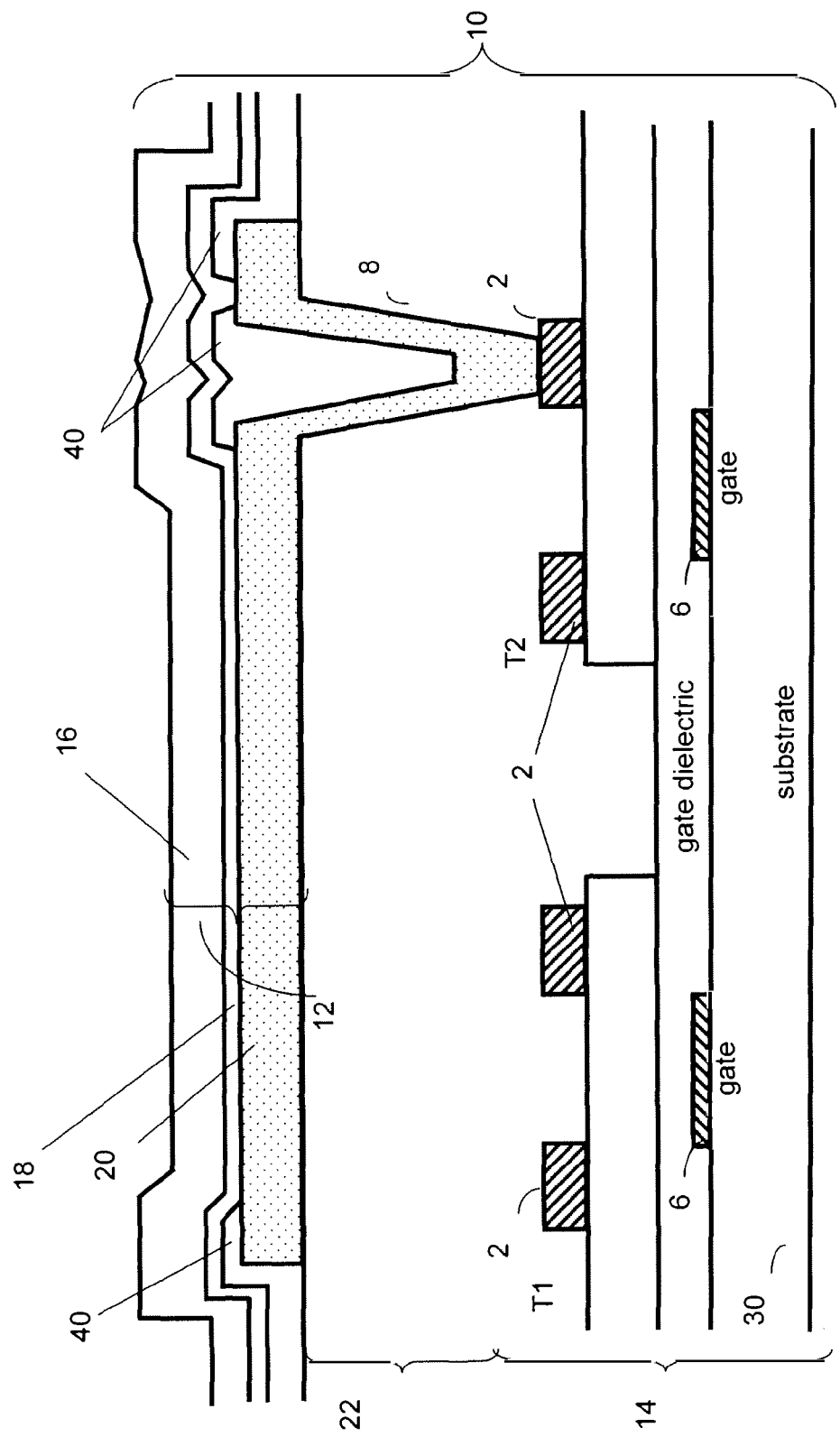
FIG. 11 is a schematic cross-section view showing a vertically integrated pixel in accordance with another embodiment of the present invention.
Figure 12:
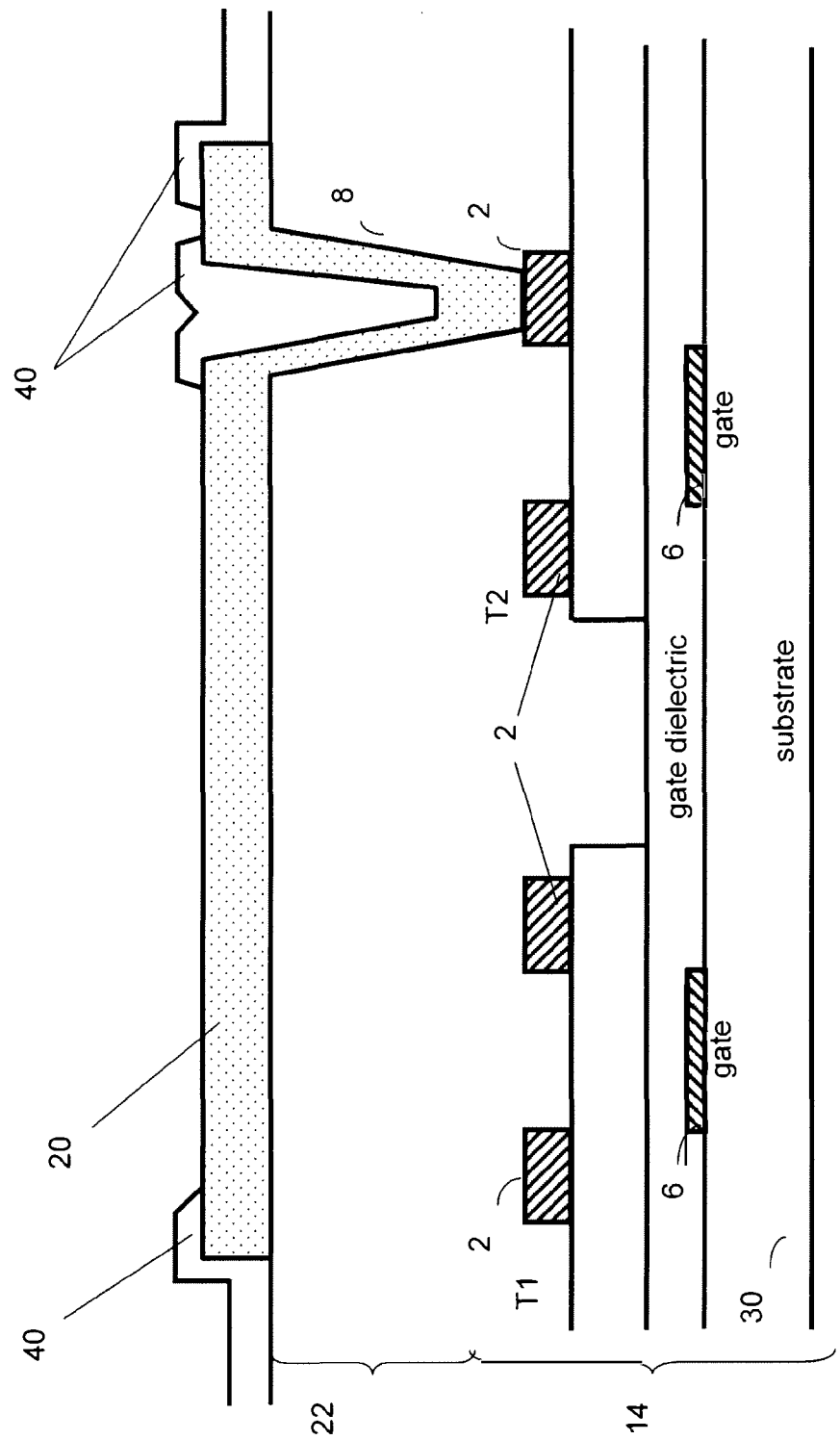
FIG. 12 is a schematic diagram showing fabricating process of the pixel of FIG. 11.

FIG. 11 shows a vertically integrated TFT-OLED pixel in accordance with another embodiment of the present invention. The dielectric layer 22 and the through-via profile of FIG. 11 are similar to those of FIG. 2.

The pixel 10 of FIG. 11 further includes an additional dielectric layer, i.e., dielectric cap 40, which is deposited on the top of the OLED bottom electrode 20. The dielectric cap 40 is patterned so as to cover the via area and the edges of the OLED bottom electrode pattern leaving the rest of the OLED bottom electrode 20 uncovered. The OLED layers 18 and the top electrode 16 are deposited in a similar manner as described above.

The dielectric cap 40 is provided to avoid breakage of continuously deposited OLED top electrode layers at the pixel edges, and therefore to prevent shortage of OLED devices. Further, the dielectric cap 40 insulates the via area, which, depending on the structure and fabrication method of the TFT backplane 14, may have higher surface roughness than the rest of the OLED bottom electrode 20 and may be therefore a source of the shortage of the OLED device.

The dielectric cap 40 is made of material, which may be either polymer dielectric (such as, BCB, polyimide, other polymer dielectric) or inorganic insulator (such as, silicon oxide, silicon nitride, silicon oxide-nitride).

The thickness of the polymer insulator may be from a few 100 nm to a few micron. With the polymer insulator, as shown above, the sidewall profile of the cap pattern can be made smooth enough to enable continuous coverage with the OLED layers 18 and OLED top electrode 16.

With inorganic insulator, the thickness of the dielectric cap 40 is adjusted in such a way to enable continuous coverage of the profile steps associated with the cap layer by the OLED top electrode 16. The thickness of an inorganic insulator can be between 50 and 500 nm (most preferably 50 to 200 nm). In addition, the conditions of dry or wet patterning of an inorganic insulator, such as silicon oxide or the like, can be adjusted to form the sloped sidewalls.

One example of the fabricating process for the pixel 10 of FIG. 11 is seen from FIGS. 6 to 8, 11 and 12. As the TFT backplane 14 is formed on the substrate 30 (FIG. 6), the planarization dielectric 22 is applied where the vias 8 with sloped sidewalls are opened to the source-drain metal 2 (FIG. 7). A conductive material is deposited and patterned to form the OLED bottom electrode 20 (FIG. 8). Then, the dielectric cap 40 is disposed as described above (FIG. 12). Then, the OLED layers 18 and the electrode are disposed and which completes the formation of the pixel structure shown in FIG. 11.

Figure 13:
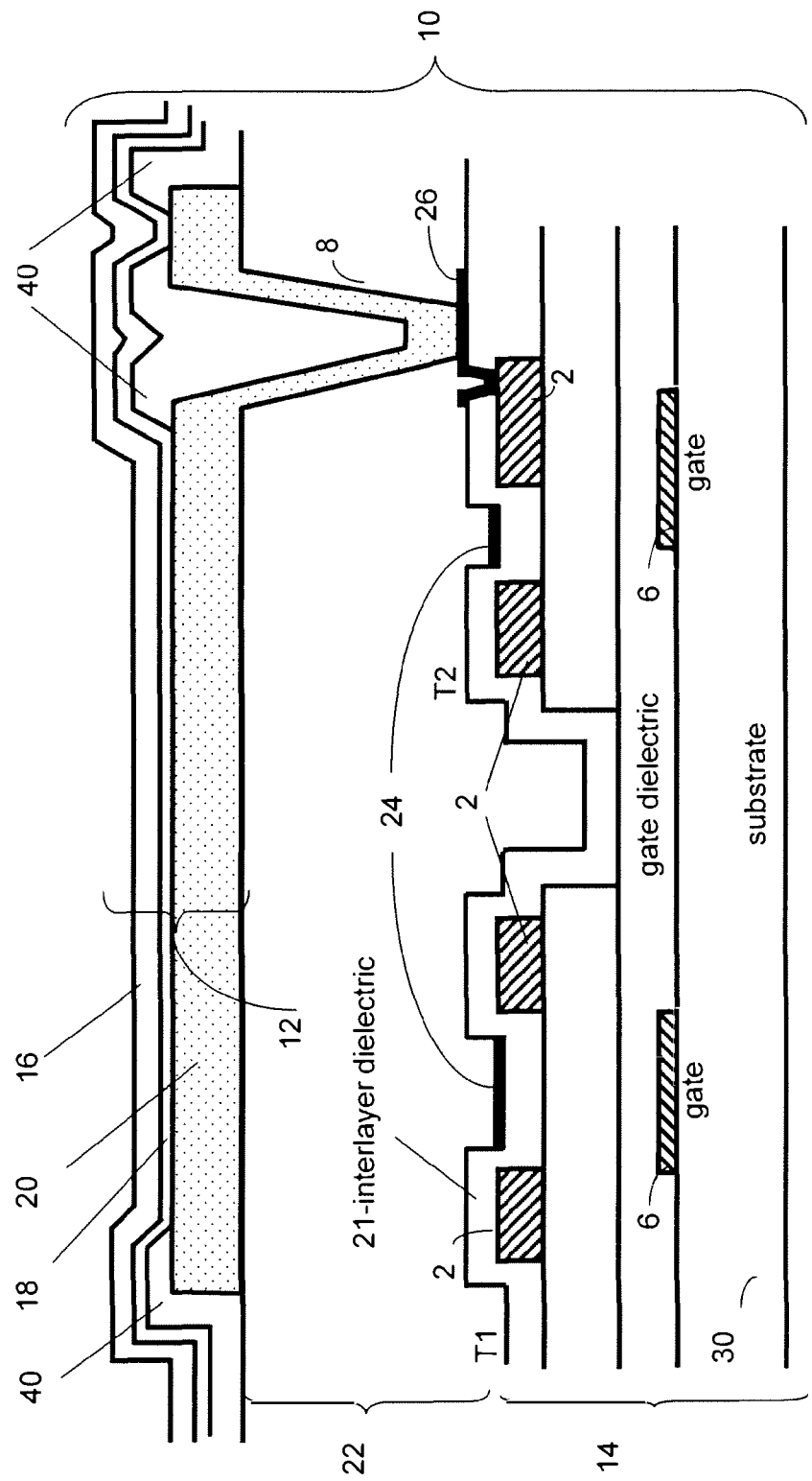
FIG. 13 is a schematic diagram of a vertically integrated pixel in accordance with another embodiment of the present invention.

FIG. 13 shows a vertically integrated pixel in accordance with another embodiment of the present invention. The pixel 10 in FIG. 13 includes the shield electrode 26 and the dielectric cap 40. First, the TFT backplane 14 is fabricated followed by deposition and patterning of the interlayer dielectric 21 and the shield electrode 24. The vias in the interlayer dielectric are formed to provide interconnection between the source/drain and interconnection plates 26 made in the shield metallization layer, where necessary. Next, shield metal is deposited and patterned to form the shield electrodes 24 and the interconnection plates 26. Next, the planarization dielectric 22 and the OLED bottom electrode 20 are deposited and patterned in a similar manner as described above. Then, the cap dielectric layer 40 is disposed and pattern as described in the previous embodiment. Finally, the OLED layers 18 and the OLED top electrode 16 are formed.

According to the embodiments of the present invention, the vertical pixel integration provides higher aperture ratio, which leads to: the possibility of using more advanced multi-transistor pixel driver circuit for improved display performance without taking up extra light-emitting area from the pixel; the possibility of using a TFT backplane, such as amorphous silicon, having lower mobility in contrast to poly-silicon, thereby simplifying the manufacturing process and reducing cost; and the reduction of current density through OLED providing higher operational stability and improved lifetime of the display device.

Further, the fabrication process sequences and critical processing details described above solve a variety of issues pertinent to vertical integration such as: smoothening out/planarizing vertical profiles in the dielectric layer 22 of the structures on the TFT substrate 14 to enable continuity of the OLED device layers 12; continuous sidewall coverage by pixel electrode material in the through-via profile in the dielectric 22; roughness of the order of 1 nm on the dielectric 22 and subsequent electrode layer, which enables successful OLED fabrication and to higher yield rate; and capping structure feature which do not comply to OLED fabrication process in terms of step height, sidewall angle and surface roughness by a dielectric layer. The via and edges of the electrode are covered with the dielectric cap 40.

While particular embodiments of the present invention have been shown and described, changes and modifications may be made to such embodiments without departing from the true scope of the invention which is defined in the claims.

What is claimed is:

1. A pixel having a vertical architecture, comprising:
   an organic light emitting diode (OLED) device having a bottom electrode, one or more OLED layers and a transparent top electrode for emitting light;
   a thin-film transistor (TFT) based backplane for electrically driving the OLED device, the TFT based backplane being vertically integrated with the OLED layers and located below said bottom electrode to form a top-emitting OLED, the TFT based backplane comprising:
      source and drain nodes; and
      a thin conductive electrode formed at least partially on a flat portion of the pixel area, electrically coupled to a source or drain node, and defined by a top surface, a bottom surface, and side surfaces, its thickness defined by normal distances between the top and bottom surfaces substantially smaller than its horizontal dimensions defined by the side surfaces;
   a planarization dielectric layer provided between the TFT based backplane and the OLED bottom electrode so as to planarize the vertical profile on the TFT based backplane, said planarization dielectric layer being in direct contact with both said TFT based backplane and said OLED bottom electrode;
   a via in said planarization dielectric layer to provide a communication path between said TFT based backplane and said OLED device and through said thin conductive electrode; and
   a dielectric layer deposited on top of said bottom electrode and covering said via and all the edges of said bottom electrode while leaving the rest of said bottom electrode uncovered.

2. The pixel as claimed in claim 1, wherein the sidewall of said via in the planarization layer is sloped against the TFT based backplane.

3. The pixel as claimed in claim 2, wherein the TFT based backplane includes:
   a substrate;
   an interlayer dielectric layer on the source and drain nodes; and
   an interconnection plate patterned on a via of the interlayer dielectric layer and being connected to the source or drain node and the thin conductive electrode;
   wherein the planarization dielectric layer planarizes the vertical profile on the substrate with the fabricated TFT based backplane, and the sloped via providing the communication path through the interconnection plate.

4. The pixel as claimed in claim 3, wherein the thin conductive electrode is formed on a flat portion of the interlayer dielectric layer such that the interconnection plate overlaps a part of the thin conductive electrode.

5. The pixel as claimed in claim 3, further comprising a shield electrode disposed between the planarization dielectric layer and the interlayer dielectric layer, which is located separately from the interconnection plate.

6. The pixel as claimed in claim 2, wherein the TFT based backplane includes:
   a substrate; and
   an interlayer dielectric layer on the source and drain nodes;
   wherein the thin conductive electrode is patterned on a via of the interlayer dielectric layer and is connected to the source or drain node through said via of the interlayer dielectric layer, and wherein the planarization dielectric layer planarizes the vertical profile on the substrate with the fabricated TFT based backplane.

7. The pixel as claimed in claim 6, further comprising a shield electrode disposed between the planarization dielectric layer and the interlayer dielectric layer, which is located separately from the thin conductive electrode.

8. The pixel as claimed in claim 2, wherein the TFT based backplane includes:
   a substrate;
   wherein the thin conductive electrode is formed such that the source or drain material overlaps the thin conductive electrode and the planarization dielectric layer planarizes the vertical profile on the substrate with the fabricated TFT based backplane.

9. The pixel as claimed in claim 8, further comprising a shield electrode formed separately from said thin conductive electrode.

10. The pixel as claimed in claim 1, in which said dielectric layer is patterned in such a way that it insulates the OLED layers from the OLED bottom electrode at pixel edges and in and around the via while leaving the rest of the OLED bottom electrode in the direct contact with the OLED layers.

11. The pixel as claimed in claim 10, wherein said dielectric layer includes polymer dielectric or inorganic insulator.

12. The pixel as claimed in claim 10, wherein said dielectric layer includes material selected from the group from BCB, polyimide, polymer dielectric, silicon nitride and a thin film inorganic.

13. The pixel as claimed in claim 1, wherein the pixel has a roughness of the order of 1 nm on the planarization dielectric layer and subsequent electrode layer.

14. The pixel as claimed in claim 1, further comprising continuous sidewall coverage by pixel electrode material in the via profile in the planarization dielectric layer.

15. The pixel as claimed in claim 1, further comprising a shield electrode formed over the TFT.

16. The pixel as claimed in claim 1, wherein the planarization dielectric layer includes photosensitive benzocylobutene (BCB), the slope of the via being adjusted by the exposure time of the photosensitive BCB.

17. A method of fabricating a pixel, the pixel having an organic light emitting diode (OLED) bottom electrode, one or more OLED layers on the OLED bottom electrode, a transparent top electrode, and a thin-film transistor (TFT) based backplane for electrically driving the OLED and including a substrate, the method comprising the steps of:
providing the TFT based backplane on said substrate, including forming within the TFT based backplane a thin conductive electrode at least partially on a flat portion of the pixel area and electrically coupled to a source or drain node of the TFT based backplane, the thin conductive electrode defined by a top surface, a bottom surface, and side surfaces, its thickness defined by normal distances between the top and bottom surfaces substantially smaller than its horizontal dimensions defined by the side surfaces;
providing a dielectric layer on the TFT based backplane, including the step of planarizing a vertical profile in the dielectric layer so as to planarize the vertical profile on the substrate with the TFT based backplane, said planarized dielectric layer being in direct contact with said TFT based backplane;
forming a via in said planarization dielectric layer to provide a communication path between said TFT based backplane and said OLED device and through said thin conductive electrode;
depositing said OLED bottom electrode directly on top of said planarized dielectric layer and extending through said via into direct contact with said thin conductive electrode of said TFT based backplane; and
depositing a dielectric layer on top of said bottom electrode and covering said via and all the edges of said bottom electrode while leaving the rest of said bottom electrode uncovered.

18. A method as claimed in claim 17, wherein forming said via which provides the communication path between the TFT backplane and the OLED device through the planarization dielectric layer, comprises forming the via such that the sidewall of the via in the planarization layer is sloped against the TFT based backplane.

19. A method as claimed in claim 17, wherein providing said dielectric layer between the OLED bottom electrode and the OLED layers, comprises patterning the dielectric layer in such a way that it insulates the OLED layers from the OLED bottom electrode at pixel edges and in and around the via while leaving the rest of the OLED bottom electrode in the direct contact with the OLED layers.

20. A method as claimed in claim 17, wherein the planarization dielectric layer including photosensitive benzocylobutene (BCB), further comprising the step of adjusting the exposure time of the photosensitive BCB such that the sidewall of the via in the planarization layer is sloped against the TFT based backplane.

21. A method as claimed in claim 17, wherein the pixel is formed such that the pixel has a roughness of the order of 1 nm on the planarization dielectric layer and subsequent electrode layer.

22. A method as claimed in claim 17, further comprising the step of providing continuous sidewall coverage by pixel electrode material in the via profile in the planarization dielectric layer.

* * * * *